United States Patent
Qiu et al.

(10) Patent No.: US 6,551,652 B2
(45) Date of Patent: Apr. 22, 2003

(54) PROCESS FOR PRODUCING A PIEZOELECTRIC ELEMENT USING A FIRST SOL AND A SECOND SOL HAVING A LEAD CONTENT GREATER THAN THE FIRST SOL

(75) Inventors: Hong Qiu, Nagano (JP); Soichi Moriya, Nagano (JP); Hiroyuki Kamei, Nagano (JP); Koji Sumi, Nagano (JP); Masami Murai, Nagano (JP); Tsutomu Nishiwaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/451,147

(22) Filed: Nov. 30, 1999

(65) Prior Publication Data

US 2002/0094372 A1 Jul. 18, 2002

Related U.S. Application Data

(62) Division of application No. 09/047,463, filed on Mar. 25, 1998, now abandoned.

(30) Foreign Application Priority Data

Mar. 27, 1997 (JP) .............................. 9-076246
Aug. 21, 1997 (JP) .............................. 9-225156

(51) Int. Cl.$^7$ .............................. B05D 5/12; H04R 17/00
(52) U.S. Cl. ................ 427/100; 426/126.3; 426/126.5; 426/419.3; 29/25.35
(58) Field of Search .............................. 427/226, 229, 427/100, 126.3, 126.5, 419.2; 29/25.35

(56) References Cited

U.S. PATENT DOCUMENTS 5,502,345 A 3/1996 Kahn et al. ................. 310/358
5,507,898 A 4/1996 Aoki et al. ............. 310/358 X
5,512,796 A 4/1996 Paton .......................... 310/358
5,691,752 A 11/1997 Moynihan ............... 310/358 X
6,097,133 A * 8/2000 Shimada et al. ............ 310/358

FOREIGN PATENT DOCUMENTS

EP 0 727 832 8/1996 ........... H01L/41/24
JP 235268 * 9/1993

OTHER PUBLICATIONS

Othman et al., "A Novel Process for Alkoxide–Derived PZT Thin Films with Multi–seeding Layers" ISAF '96 Proceedings of the Tenth IEEE International Symposium on Applications of Ferroelectrics (Cat No. 96CH35948), ISAF '96 Proceedings of the Tenth IEEE International Symposium on Applications of Ferroelectrics, East Brunswick, NJ, USA 18–21 A, ISBN 0–7803–3355–1, New York, NY, USA, IEEE, pp. 731–734 vol. 2, XP002070778 *The Whole Document.

* cited by examiner

Primary Examiner—Brian K. Talbot
(74) Attorney, Agent, or Firm—Sughrue Mion, PLLC

(57) ABSTRACT

A piezoelectric element having a piezoelectric film where the difference in the quantity of lead along the thickness of the film is minimized. The film is obtained by first applying, at least once, a first sol for use in forming a PZT film on a substrate having a lower electrode formed thereon. Second, applying a second sol having the greater lead content than the first sol. Third, subjecting these films to heat treatment at a predetermined temperature at least once. The second sol has a composition capable of forming a piezoelectric film having a Perovskite structure expressed generally by $A_xB_yO_3$, and the content of material constituting the A site of the first sol is greater than what constitutes the A site of the second sol.

9 Claims, 11 Drawing Sheets

PZT FILM

LOWER ELECTRODE

PROCESS FOR PRODUCING A PIEZOELECTRIC ELEMENT USING A FIRST SOL AND A SECOND SOL HAVING A LEAD CONTENT GREATER THAN THE FIRST SOL

This is a divisional of application Ser. No. 09/047,463 filed Mar. 25, 1998, now abandoned the disclosure of which is incorporated herein by reference.

BACKGROUND OF THE INVENTION

1. Field of the Invention

The present invention relates to a piezoelectric element and a process for producing the same, and more particularly to a piezoelectric element fit for use in converting electric energy to mechanical energy and vice versa in various kinds of equipment such as an actuator, a pressure sensor, a temperature sensor and so forth.

2. Description of Related Art

Previously, piezoelectric elements have been employed as vibrators, that is, as driving sources for discharging ink from ink-jet recording heads, for example. A piezoelectric element is generally structured so that the piezoelectric element has a poly-crystalline piezoelectric film, an upper electrode and a lower electrode with the piezoelectric film held between the electrodes. Platinum is used for the lower electrode, and titanium or a titanium oxide is used as an adhesion layer between the platinum and an underlying substrate.

The piezoelectric film is generally fabricated with Pb(Zr, Ti)$O_3$ (hereinafter called "PZT") as the principal component of a three-component system with a third component added to the two-component PZT. The piezoelectric film having such a composition may be formed through a sputtering, sol-gel, laser abrasion, or CVD method.

When the aforesaid piezoelectric element is applied to the actuator of an ink-jet recording head, a piezoelectric film (PZT film) is required to be about 0.5 $\mu$m 20 $\mu$m thick, for example, and is also required to have a high piezoelectric distortion constant. In order to obtain a piezoelectric film having such a high piezoelectric distortion constant, the film has to be annealed (heat-treated) at about 600° C.–700° C. to attain the growth of crystalline grains in the piezoelectric film.

When the PZT film having a thickness of about 0.5 $\mu$m–20 $\mu$m, for example, is formed by the sol-gel method, the sol of the PZT film is subjected to spin-coating for drying and pyrolyzing purposes in several cycles. Then, the products are subjected to pre-annealing as a first step. The sol is further subjected to spin-coating for drying and pyrolyzing purposes in several cycles, and then the products are subjected to annealing as a second step. Incidentally, the PZT film is usually formed by the use of sols having the same composition for the whole layer.

When a PZT film having the aforesaid thickness is formed, there develops a problem arising from a crack in the film obtained through the step of annealing the film after it is coated with the sol once. In order to solve this problem, the sol is subjected separately to spin-coating a plurality of times.

In the method of separately subjecting the sol to spin-coating a plurality of times, however, more lead ingredient is evaporated from the then uppermost layer at the time of pre-annealing and the then uppermost layer at the time of annealing than is evaporated from the multi-layer structure. The lead may also be diffused into the base (substrate). Both effects result in the decrease of the quantity of lead in the surface layer. For this reason, there develops a problem arising from a mismatching plane in the grain boundary of the layer formed at the time of pre-annealing the PZT film (hereinafter may be called the "lower layer) and the layer formed at the time of annealing (hereinafter may be called the "upper layer"). Moreover, another problem is that a decrease in the quantity of lead in the surface makes this surface portion have low-dielectric characteristics which tends to lower the piezoelectric characteristics.

The relation between x and y in a composition which is expressed by the general term $A_xB_yO_3$ for use in forming the piezoelectric film becomes y>x instead of x:y=1:1 as it should have been. This creates a problem because the B site becomes excessive and affects crystalline growth, and the piezoelectric characteristics are reduced as the crystal orientation is lowered.

To combat this problem, a method of excessively adding lead to the sol of the PZT film has been devised. However, the addition of excess lead decreases the withstand voltage of the film, which offsets any improvements in the piezoelectric characteristics.

SUMMARY OF THE INVENTION

An object of the present invention is to solve the foregoing problems by providing a piezoelectric element with improved piezoelectric and dielectric characteristics and a method of producing such a piezoelectric element which does not degrade the withstand voltage of the film.

In order to accomplish the object above, a piezoelectric element according to the present invention comprises a piezoelectric film, an upper electrode and a lower electrode with the piezoelectric film held between the electrodes is structured such that the piezoelectric film is formed through the steps of forming a film by applying a first sol for forming the piezoelectric film at least once, forming a film on the film coated with the first sol by applying a second sol having a greater lead content than the first sol, and subjecting both films to heat treatment at a predetermined temperature.

The piezoelectric film can further be built up by forming a film on the heat-treated film by applying the first sol at least once, forming a film on the film coated with the first sol by applying the second sol, and subjecting both the films to heat treatment at a predetermined temperature.

In the piezoelectric element thus formed, the ratio of lead in the thickness direction of the piezoelectric film is more uniform than the piezoelectric film of a conventional piezoelectric element. In other words, a difference in the existing quantity of lead along the thickness of the film is minimized, whereby both piezoelectric and dielectric characteristics are improved.

Further, a piezoelectric element comprising a piezoelectric film, an upper electrode and a lower electrode with the piezoelectric film held between the electrodes is such that the piezoelectric film is expressed by the general chemical formula $A_xB_yO_3$ (where, A=Pb, La or Ca or a combination thereof; and B=Ti, Zr, Mg or Nb, or a combination thereof with a stoichiometric ratio of x to y expressed by x:y=1:1). When x=1 is set to 100%, the difference in the existing quantity of lead along the thickness of the film is 44% or less. Moreover, the piezoelectric film has a Perovskite structure.

The piezoelectric and dielectric characteristics are both improved as lead uniformly exists in the piezoelectric film as compared with the conventional film.

A process for producing a piezoelectric element comprising a piezoelectric film, an upper electrode and a lower electrode with the piezoelectric film held therebetween according to the present invention comprises the steps of first applying at least once, a first sol for use in forming the piezoelectric film on a substrate having the lower electrode formed thereon; second, applying a second sol having a greater lead content than the first sol; and third, subjecting the resulting films to heat treatment at a predetermined temperature after the second step.

In this process for producing a piezoelectric element, even though more of the lead component is evaporated from the layer formed with the second sol than any other layer or is caused to be diffused into the base (substrate) when the heat treatment is made at the third step, the content of lead in this layer is prevented from becoming smaller than that in the underlying structure because the content of lead has been increased therein beforehand.

A cycle comprising the first, second and third steps may be repeated at least once after the termination of the third step. Thus, the piezoelectric film is formed free from a crack, and a piezoelectric film having any desired thickness can be manufactured. With the above process, a mismatching plane is prevented from being formed on the grain boundary between the layers of films in each cycle.

The second sol may contain lead in greater amounts than the lead contained in the piezoelectric film which is desired and to be ultimately obtained. The lead quantity or the second sol should exceed the lead quantity of the desired piezoelectric film by not less than 5% and not greater than 43%.

Preferably, the second sol contains lead greater by not less than 20% and not greater than 30% than the lead contained in a piezoelectric film to be ultimately obtained.

A film formed by applying the second sol may be formed on the film formed by applying the first sol three times and both the films may be subjected to heat treatment at the predetermined temperature. Further, a film formed by applying the first sol three times may be formed on the heat-treated film and a film formed by applying the second sol may be formed thereon and then these films may be subjected to heat treatment at the predetermined temperature.

A cycle comprising the first, second and third steps may be repeated twice. Further, the second step may proceed after the first step is repeated three times.

A process for producing a piezoelectric element comprising a piezoelectric film, an upper electrode and a lower electrode with the piezoelectric film held between the electrodes comprises the steps of first applying, at least once, a first sol for use in forming the piezoelectric film on a substrate having the lower-electrode formed thereon; second, applying a second sol for use in forming the piezoelectric film; and third, subjecting the resulting films to heat treatment at a predetermined temperature after the second step, wherein the first and second sols have a composition capable or forming a piezoelectric film having the Perovskite crystalline structure and is expressed generally by $A_xB_yO_3$ and wherein the content of material constituting the A site of the first sol is greater than what constitutes the A site of the second sol.

In the piezoelectric film of the piezoelectric element thus manufactured through the aforesaid process, crystalline growth occurring at the time of heat treatment for crystallization is promoted. Therefore, orientation is increased and piezoelectric characteristics are improved.

The $A_xB_yO_3$ may comprise Pb, La or Ca or a combination thereof as A, and Ti, Zr, Mg or Nb or a combination thereof as B.

A partial component of the B site or its oxide may be used for the lower electrode as an adhesion layer with respect to the substrate.

The content of material constituting the A site of the first sol may exceed the content of material constituting the A site of the second sol, but the A site content of the first sol should be less than 1.4 times that of the second sol. An exemplary range for the A site of the first sol relative to the A site of the second sol is 1.2–1.3, inclusive.

DESCRIPTION OF THE DRAWINGS

Preferred embodiments of the invention will follow with reference to the drawings, wherein.

DETAILED DESCRIPTION OF PREFERRED EMBODIMENTS

Figure 1:
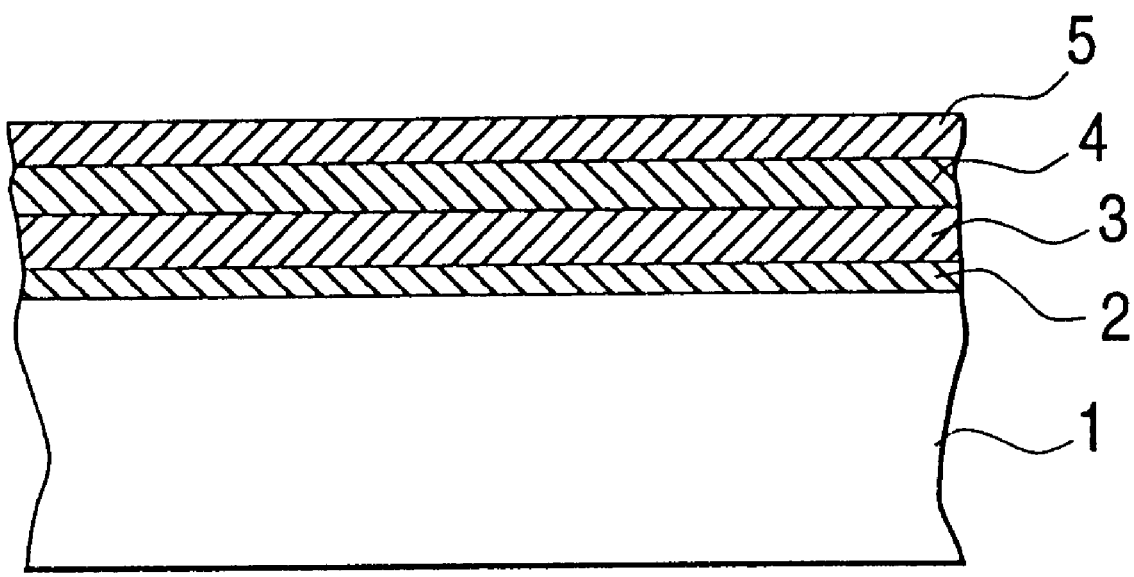
FIG. 1 is a sectional view showing a piezoelectric element according to a first embodiment of the present invention.

As shown in FIG. 1, a piezoelectric element according to a first embodiment of the present invention comprises a silicon substrate 1 (film thickness: about 220 μm), a silicon oxide film 2 (film thickness: about 1 μm), a lower electrode 3 (film thickness: about 0.7 μm), a PZT film 4 (film thickness; about 1 μm), and an upper electrode 5 (film thickness; about 0.2 μm). These layers are laid up on the silicon substrate 1 in the aforesaid order.

The lower electrode 3 has a multilayer structure (not shown) comprising a titanium layer (film thickness: about 0.025 μm), a titanium oxide layer (film thickness: about 0.02 μm), a titanium layer (film thickness: about 0.005 μm), a platinum layer (film thickness: about 0.65 μm), and a titanium layer (film thickness: about 0.005 μm) in order as viewed from the silicon substrate 1.

The quantity of lead along the thickness direction of the PZT film 4 has a difference of 44% or less, providing a fairly uniform lead content throughout the film. The value of 44% or less corresponds to a lead quantity when the PZT film 4 is expressed by a chemical formula of $A_xB_yO_xO_3$ (where, A=Pb, La or Ca or a combination thereof, and B=Ti, Zr, Mg or Nb, or a combination thereof, with a stoichiometric ratio of x to y expressed by x:y=1:1 when x=1 is set to 100%. The PZT film 4 may have a Perovskite structure.

This piezoelectric element is manufactured through the steps shown in FIGS. 2(A)–(C) and 3(A)–(C). A detailed description will subsequently be given of the process steps.

Figure 2:
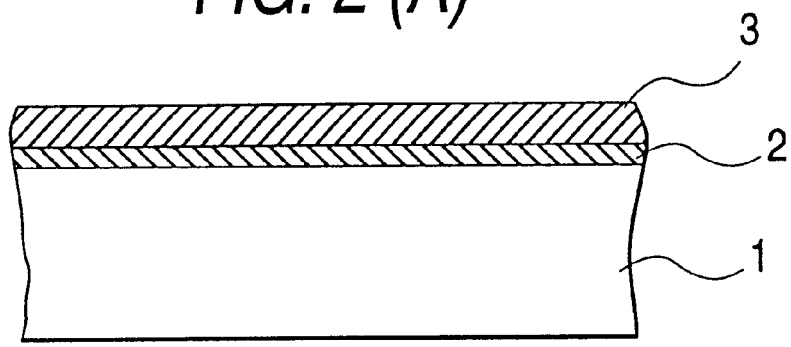
FIGS. 2(A)–2(C) are sectional views showing the steps of manufacturing the piezoelectric element shown in FIG. 1.
Figure 2:
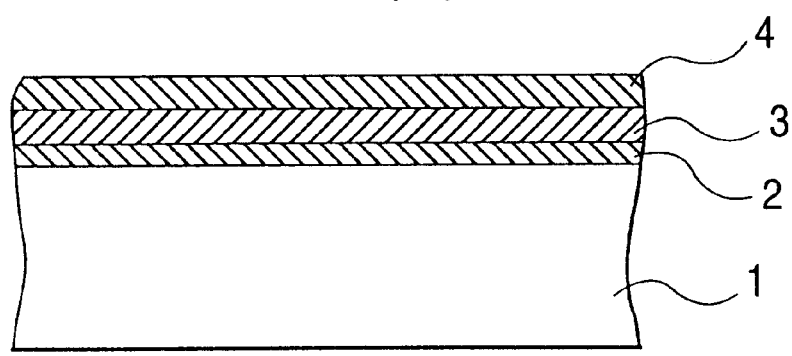
Figure 2:
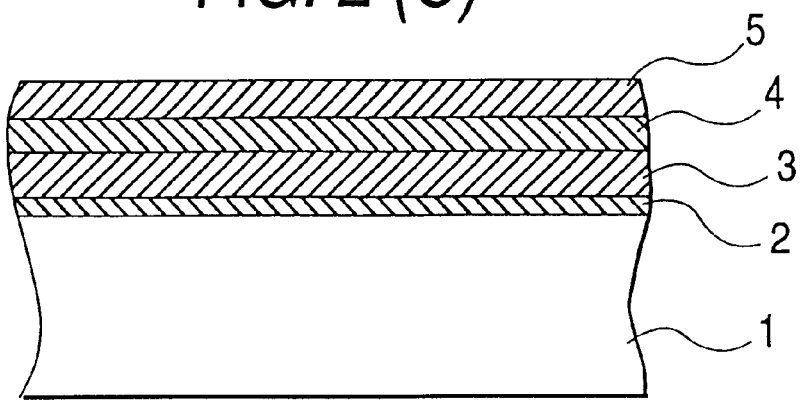

As shown in FIG. 2(A), the silicon oxide film 2 about 1 μm thick is formed by thermal oxidation on the silicon substrate 1, which is about 220 μm thick. Subsequently, the lower electrode 3 is formed on the silicon oxide film 2 through the sputtering method. The lower electrode has a multilayer structure (not shown) comprising a titanium layer (film thickness: about 0.025 μm), a titanium oxide layer (film thickness: about 0.02 μm), a titanium layer (film thickness: about 0.005 μm), a platinum layer (film thickness: about 0.65 μm), and a titanium layer (film thickness: about 0.005 μm) in order as viewed from the silicon substrate 1.

As shown in FIG. 2(B), the PZT film 4 is formed on the lower electrode 3. Since the PZT film 4 is about 1 μm thick, a plurality of sols for forming the PZT film 4 are individually subjected to spin-coating before being heat-treated.

Figure 3:
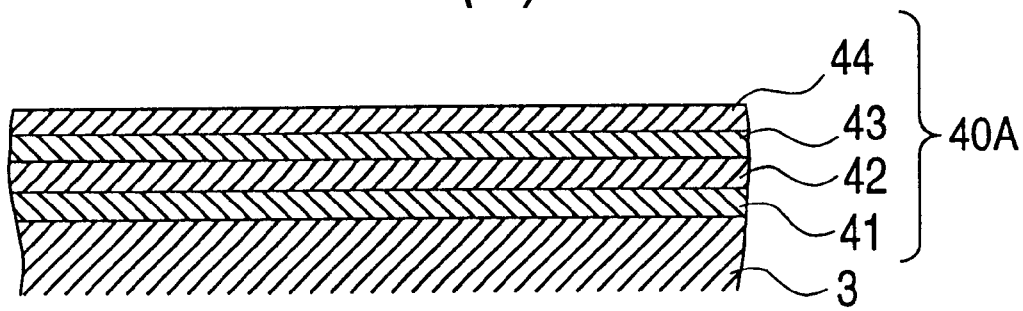
FIGS. 3(A)–3(C) are detailed sectional views of the piezoelectric film of FIG. 2(B)
Figure 3:
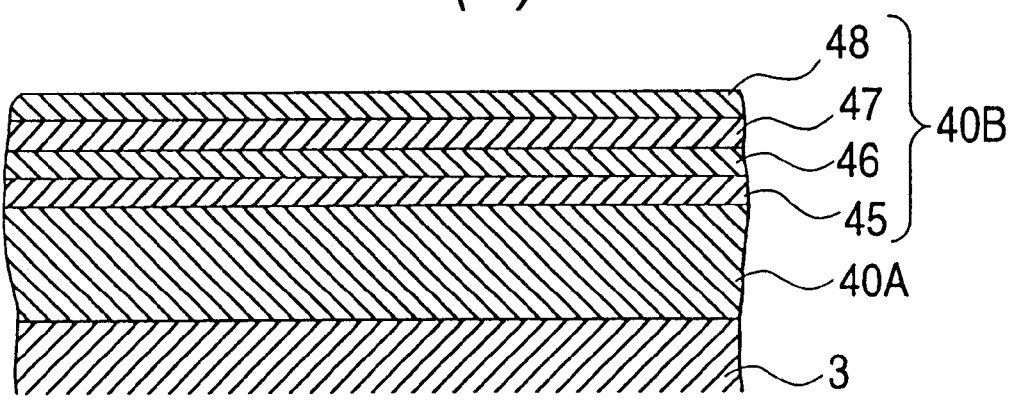
Figure 3:
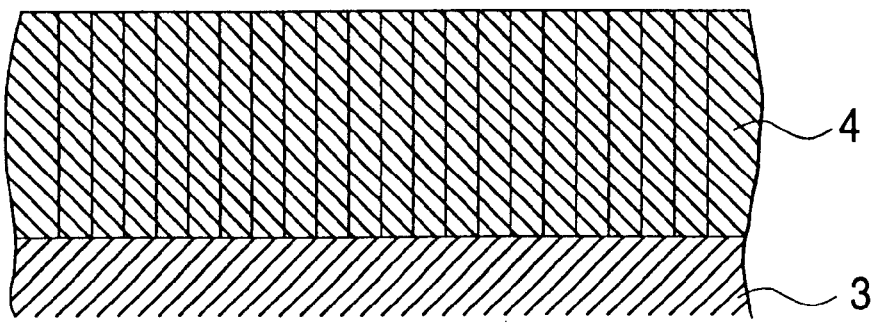

More specifically, as shown in FIG. 3(A), a spin-coating machine is used to coat the lower electrode 3 with a first sol for forming the PZT film, and the product is dried at about 190° C. before being pyrolyzed at about 400° C. in order to form a PZT film 41 which is about 0.1–0.15 μm thick. This cycle is repeated twice so as to form PZT films 42, 43 on the PZT film 41.

A composition containing lead greater in quantity by 5% than what is contained in a PZT film to be obtained is used as the first sol according to this embodiment of the present invention.

Then the spin-coating machine is used to coat the PZT film 43 with a second sol containing lead greater in quantity by 15% than what is contained in the first sol (i.e., lead greater in quantity by 20% than what is contained in a PZT film to be ultimately obtained), and the product is dried at about 180° C. before being pyrolyzed at about 400° C. in order to form a PZT film 44 which is about 0.1–0.15 μm thick.

Then the RTA (Rapid Thermal Annealing) is employed for continuously heat-treating the PZT films 41–44 thus obtained at 550° C. for five minutes and subsequently 675° C. for one minute in an atmosphere of oxygen in order to form a PZT film 40A as a lower layer. With this heat treatment, more lead is evaporated from the PZT film 44 than what is contained in the other PZT films 41–43, or otherwise the lead is diffused into the silicon substrate 1. The PZT film 44 is formed with the second sol containing lead greater in quantity than by 15% than that contained in the other PZT films 41–43. However, the lead excessively contained in the PZT film 44 is offset during heat treatment, whereby the quantity of lead contained in the PZT film 44 is prevented from decreasing to a low quantity in comparison with what is contained in the PZT films 41–43. Since the quantity of lead excessively contained in the second sol has been adjusted, the optimum quantity of lead is uniformly distributed in the thickness direction of the PZT film 40A as the lower layer.

As shown in FIG. 3(B), steps similar to those taken to form the PZT films 41–43 in FIG. 3(A) are followed to form PZT films 45–47 on the PZT film 40A as the lower layer. Then a step similar to what is taken to form the PZT film 44 in FIG. 3(I) is followed to form a PZT film 48 on the PZT film 47. Further, heat treatment is provided at the structure shown in FIG. 3(B). Here, heat treatment is performed at 600° C. for five minutes and continuously at 850° C. for one minute to form a PZT film 40B as an upper layer. Lead is uniformly distributed in the thickness direction of the PZT film 40B as the upper layer as was the case of the PZT films of 40A as the lower layer. Thus, the PZT film 4, including the films 40A as the lower layer and the films of 40B as the upper layer is obtainable (see FIG. 3(C)).

Figure 4:
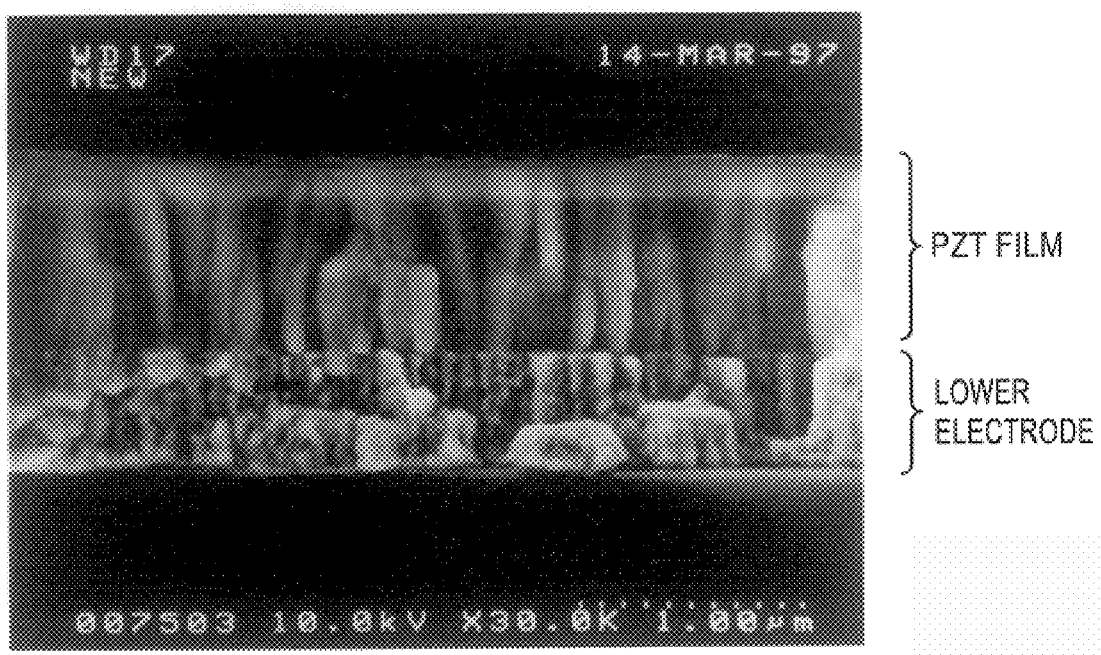
FIG. 4 is a photograph taken by a scanning electronic microscope (SEM) for showing the cross section of the piezoelectric element shown in FIG. 1.
Figure 5:
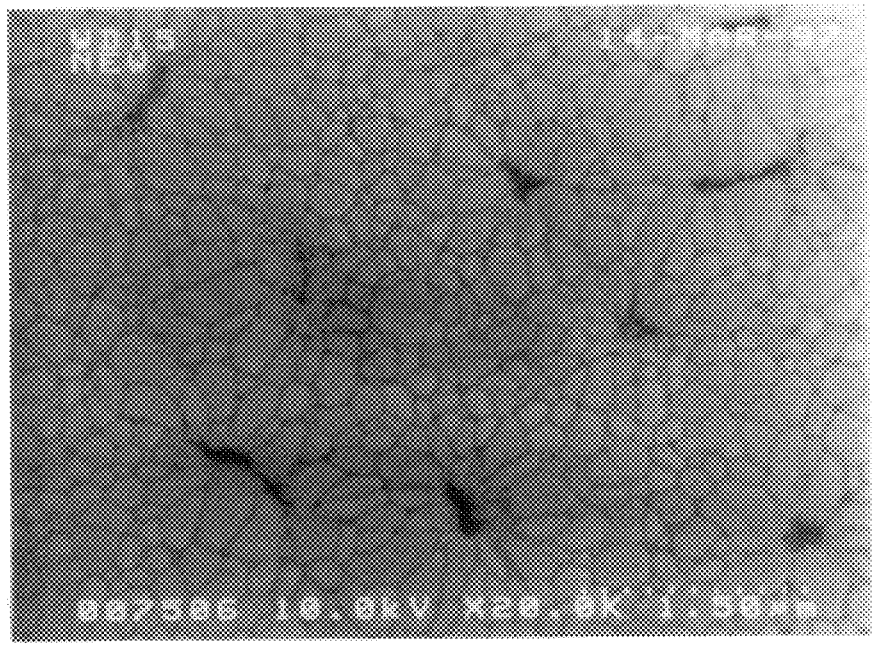
FIG. 5 is a photograph taken by a scanning electronic microscope (SEM) for showing the surface of the piezoelectric element shown in FIG. 1.

It has been confirmed, as shown in FIG. 4, that almost no mismatching plane is produced between the grain boundaries of the PZT film 40A as the lower layer and the PZT film 40B as the upper layer. As shown in FIG. 5, moreover, it has also been confirmed that lead is uniformly distributed without being hardened at one place.

As shown in FIG. 2(C), the upper electrode 5, which is about 0.2 μm thick, is formed on the PZT film 4. Subsequently, the desired piezoelectric element is obtained through patterning, and other desired processing steps.

For the purpose of comparison, a piezoelectric element (as a comparative example) is formed in accordance with the above-described steps of the present invention except that the PZT films 44 and 48 were formed with the first sol rather than the second sol.

Figure 6:
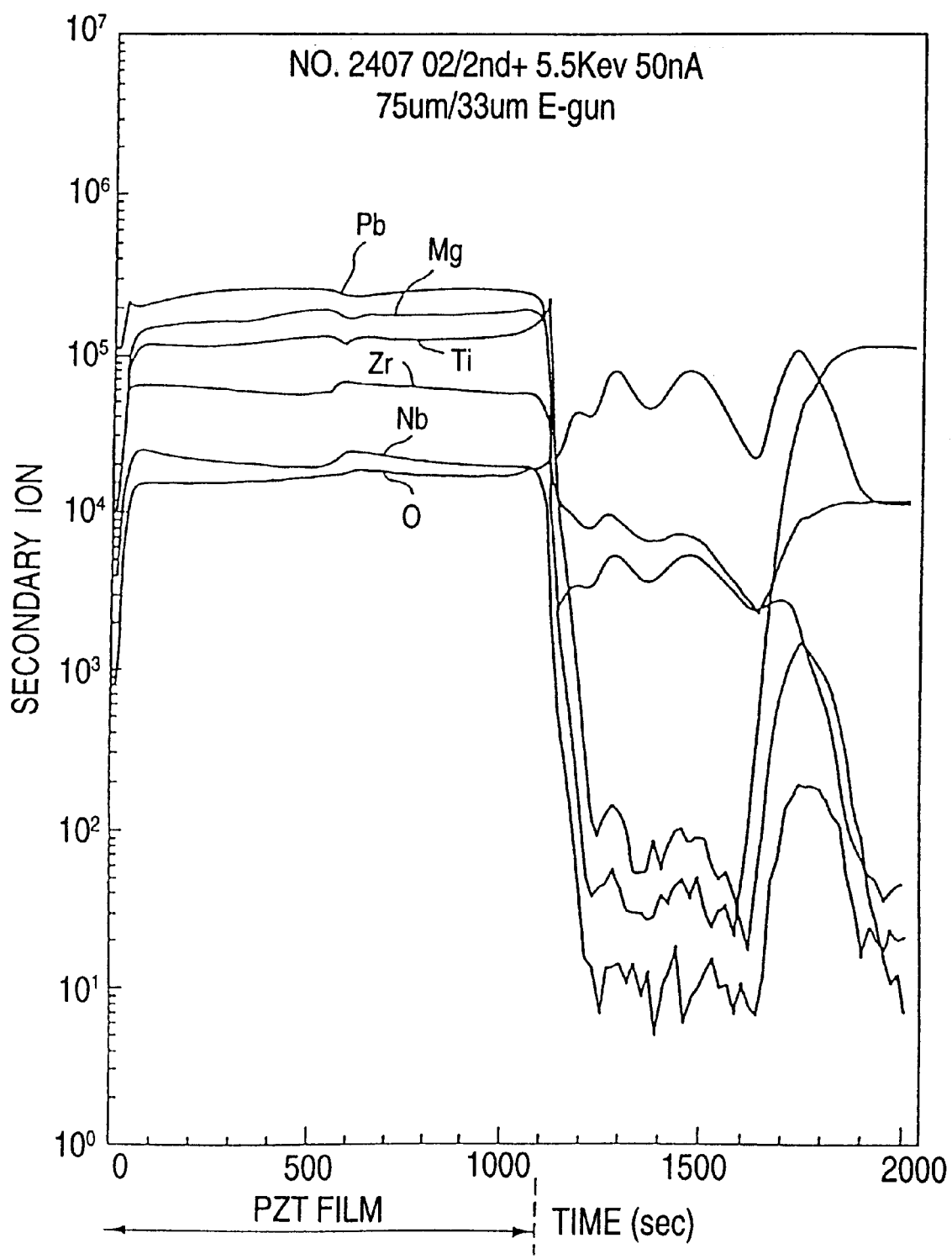
FIG. 6 is a graph showing the results of a secondary ion mass spectrometer (SIMS) analysis of the element obtained as the first embodiment of the present invention.
Figure 7:
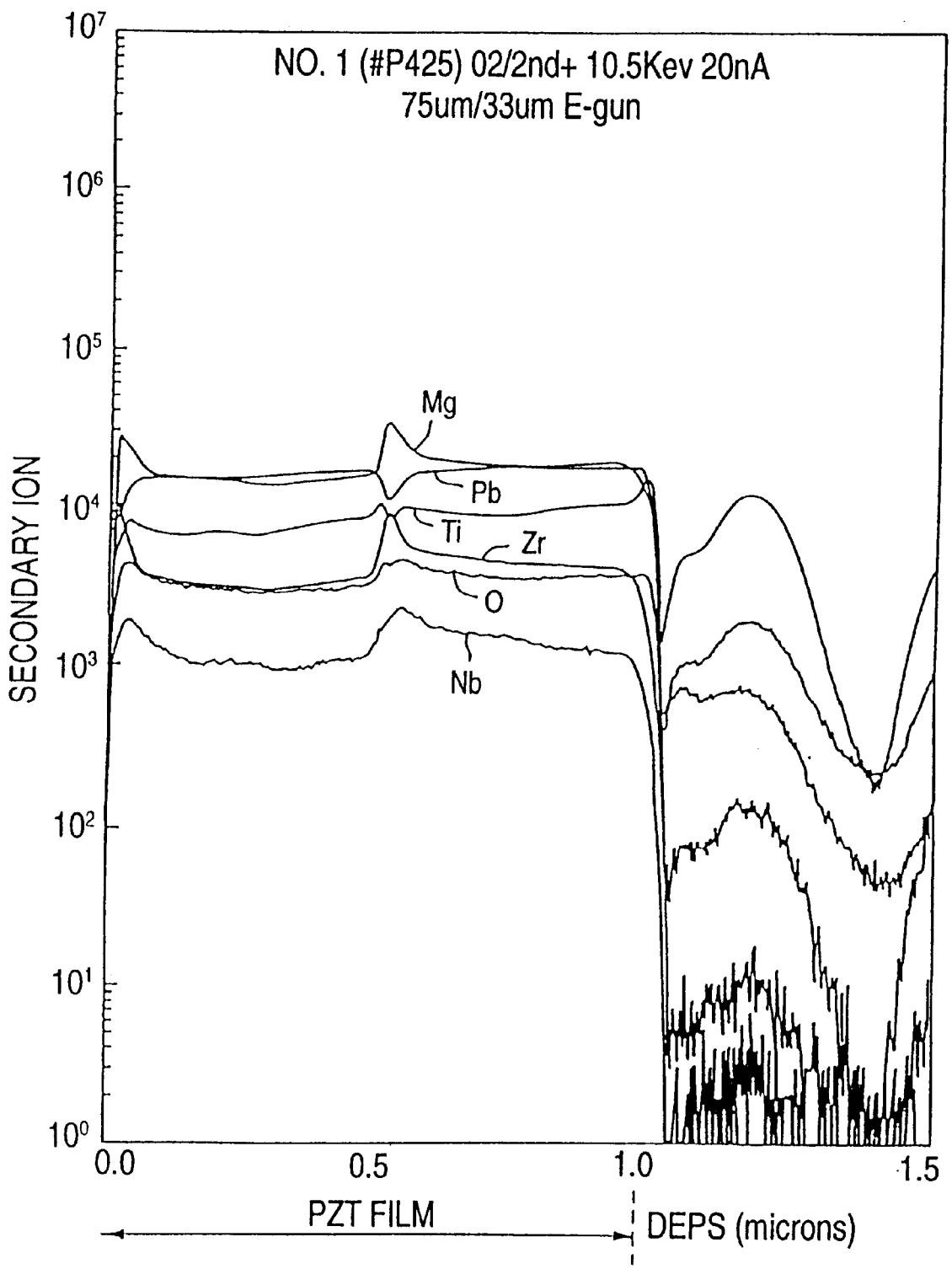
FIG. 7 is a graph showing the results of a SIMS analysis of a comparative example using the process used to produce the first embodiment of the present invention.

In order to investigate variations in the quantity of lead along the thickness of the PZT film in the product obtained according to this embodiment of the present invention in contrast with the comparative example, a SIMS (Secondary Ion Mass Spectrometer) is employed for analyzing purposes. FIG. 6 shows the results of the SIMS analysis of the product according to the present invention, and FIG. 7 shows the SIMS analysis of the comparative example.

As shown in FIG. 6, the existing quantity of lead along the thickness of the PZT film according to the present invention is seen to be uniformly distributed. By contrast, in FIG. 7, the existing quantity of lead is seen to decrease in the proximity of the intermediate portion in the thickness direction of the PZT film 4. More particularly, the lead quantity decreases in the proximity of the boundary between the PZT film formed from the lower layer and the PZT film formed from the upper layer.

This decreased quantity of lead is observed because the PZT film in the comparative example is formed with only the first sol. Lead is evaporated from the uppermost layer at the time of heat treatment and/or otherwise diffused into the silicon substrate, and therefore the existing quantity of lead at the boundary decreased relative to the rest of the sample.

Subsequently, a piezoelectric constant (d31(pC/N)), a dielectric constant (εr(−)) and withstand voltage (V/μ) were measured as shown in Table 1.

TABLE 1

| Characteristic | Comparative Example | Invention | Comments |
|---|---|---|---|
| Piezoelectric Constant d31 (pC/N) | 115 | 141 | Invention shows 23% improvement |
| Dielectric Constant εr (−) | 1220 | 1489 | Invention shows 22% improvement |

TABLE 1-continued

| Characteristic | Comparative Example | Invention | Comments |
| --- | --- | --- | --- |
| Withstand voltage (V/μ) | 76 | 90 | Invention shows no reduction |

As shown in Table 1, it is confirmed that in comparison with the comparative example, the present invention showed improvement in the piezoelectric constant by about 23% and improvement in the dielectric constant by about 22% without lowering of the withstand voltage.

Figure 8:
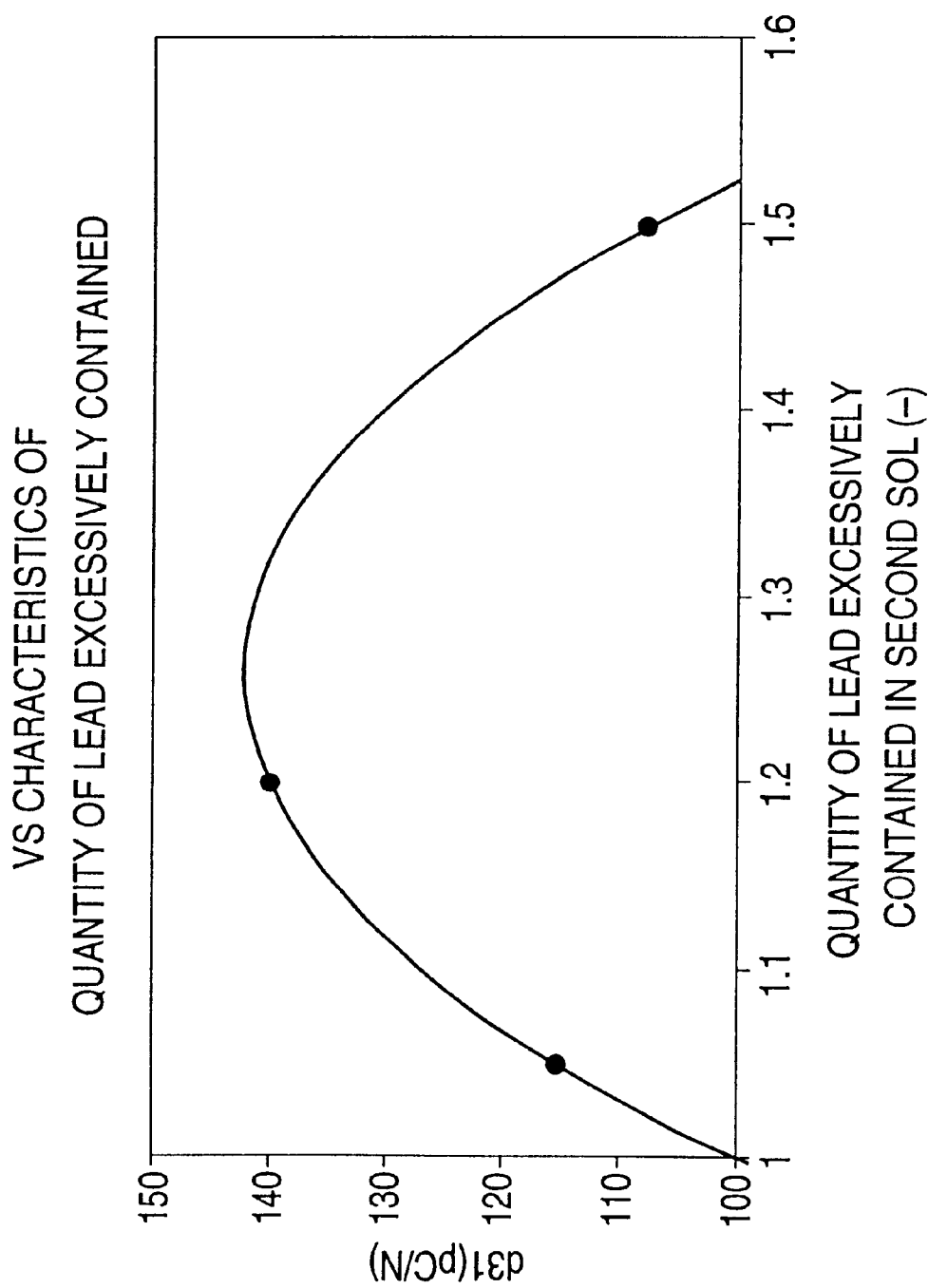
FIG. 8 is a graph showing the piezoelectric constant of a PZT film in relation to the quantity of lead excessively contained in a second sol of the PZT film obtained by the present invention.
Figure 9:
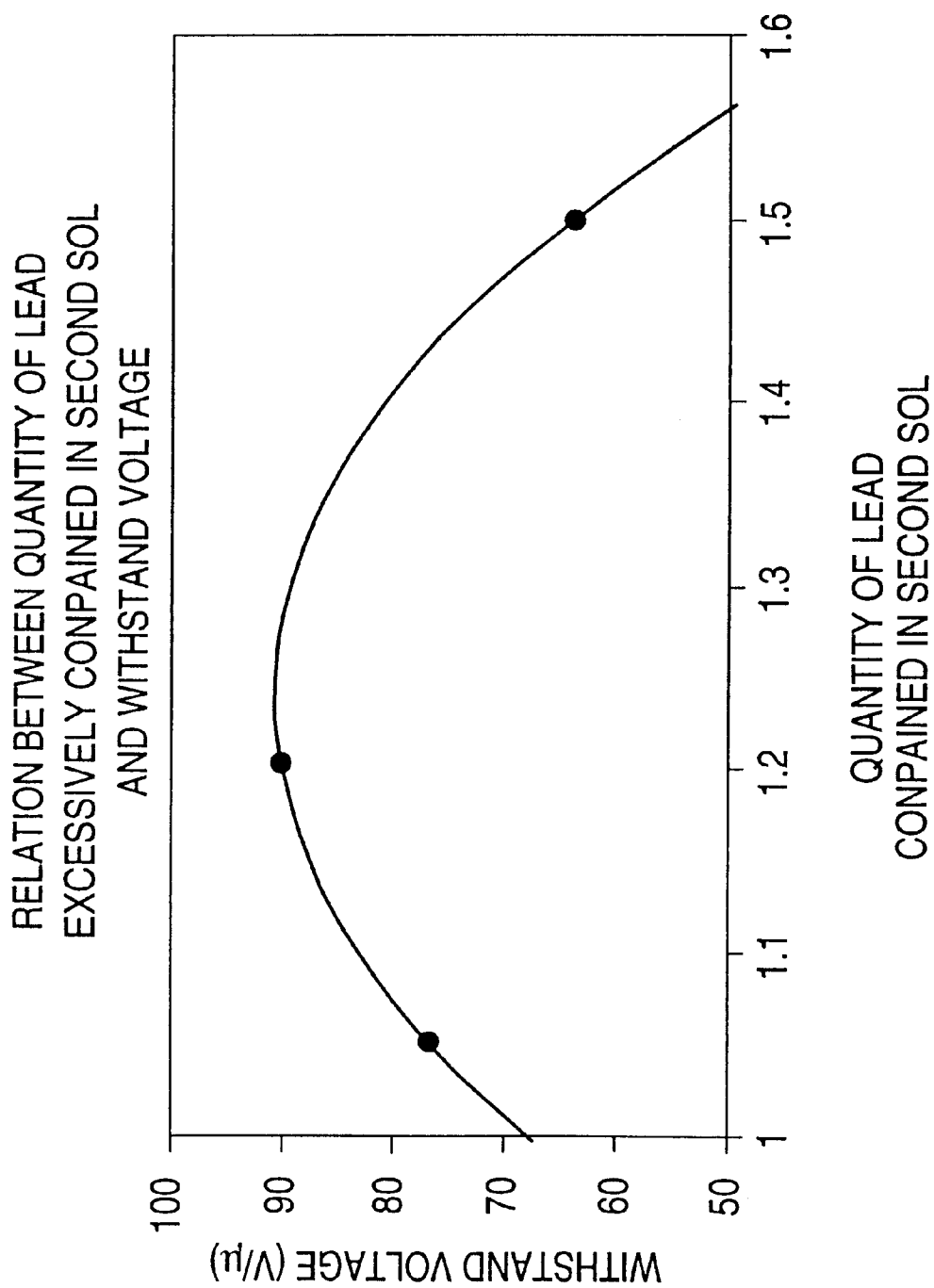
FIG. 9 is a graph showing the withstand voltage of a PZT film in relation to the quantity of lead excessively contained in the second sol obtained by the present invention.

Several piezoelectric elements with a PZT film were formed using the process described above. The PZT films were formed by varying the quantity of lead excessively contained in the second sol relative to the first sol. Each of the piezoelectric elements were examined to check the piezoelectric constant of the PZT film. FIG. 8 shows the results. Further, the withstand voltage of the PZT film of each piezoelectric element were also examined. FIG. 9 shows the results.

As shown in FIG. 8, it has been shown that the piezoelectric constant can be improved by increasing the quantity of lead contained in the second sol by 5%–47%, preferably 20%–30% relative to the PZT film that is ultimately to be produced.

As shown in FIG. 9, moreover, it has also been shown that the withstand voltage can be improved by increasing the quantity of lead contained in the second sol by 5% –43%, preferably 20%–30% relative to the PZT film that is ultimately to be produced.

Although a description has been given of the case where the PZT film 40A as the lower layer and the PZT film 40B as the upper layer are respectively constituted of four layers in Embodiment 1, the present invention is not limited to this structure. The invention is also applicable to a case where the first sol is applied to the films before they are dried and pyrolyzed in one cycle and then the second sol having a greater lead content than the first sol is applied thereto before they are dried, pyrolyzed and heat-treated at a predetermined temperature.

Although a description has been given of the case where the PZT film 4 has a difference of 44% or less of the existing quantity of lead along the film thickness in Embodiment 1 of the present invention, the invention is not limited to this embodiment. Rather, the piezoelectric element only need be characterized with a film formed by applying a second sol having a greater lead content than a first sol onto the film coated with the first sol at least once and heat-treating it at the predetermined temperature. With the arrangement above, it is possible to provide a piezoelectric element having the least difference in the existing quantity of lead in the thickness direction of the piezoelectric film.

Referring to FIGS. 10(A)–(C) and 11(A)–(C), there is given a description of a second embodiment of the present invention in this description of the second embodiment, like reference characters are given to elements corresponding to like members of the first embodiment. Detailed descriptions of these like members are omitted here.

Figure 10:
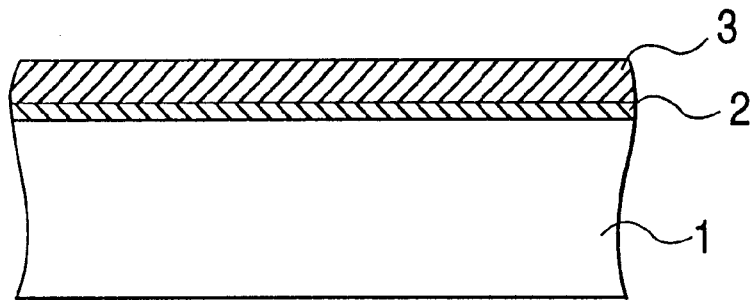
FIGS. 10(A)–10(C) are sectional views showing the steps of manufacturing a piezoelectric element according to a second embodiment of the present invention.
Figure 10:
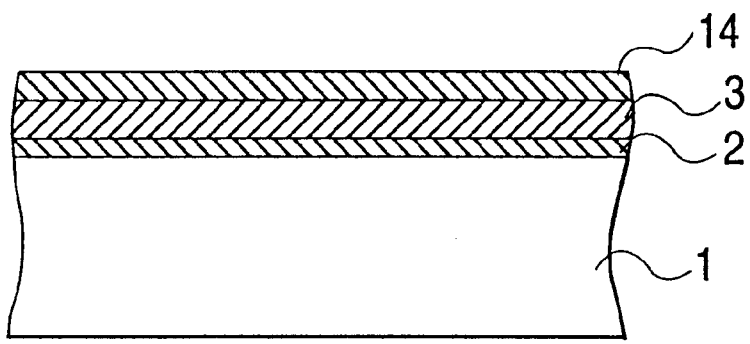
Figure 10:
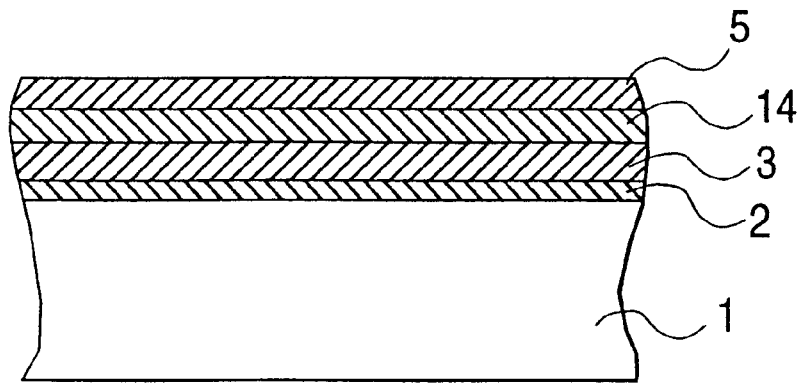

As in Embodiment 1, the silicon oxide film 2 and the lower electrode 3 are successively formed on the silicon substrate 1 at the step shown in FIG. 10(A).

At the subsequent step shown in FIG. 10(B), a PZT film 14 is formed on the lower electrode 3. In this case, the PZT film 14 having a thickness of about 1 μm is formed. More specifically, the first step of applying the first sol for forming the PZT film 14 is taken at least once and the second step of applying the second sol is followed to form the PZT film 14. As a third step, the layers are subjected to heat treatment at predetermined temperatures.

As the first and second sols, a piezoelectric film having the Perovskite structure expressed by the general term $A_xB_yO_3$ can be used. More specifically, in Embodiment 2, Pb, La or Ca is employed as A, whereas $Zr_{0.52}$ and $Ti_{0.48}$ are employed as B. Further, the first sol is prepared so that the value of x in the general term is 1.3 and the value of y is 1. The second sol is prepared so that the value of x in the general term is 1 and the value of y in the general term is 1.

A specific method of manufacturing the PZT film 14 is described below with reference to FIG. 11(A), The spin-coating machine is used to coat the lower electrode 3 with the first sol for forming the PZT film 14, and the product is dried at about 180° C. before being pyrolyzed at about 400° C. in order to form a PZT film 141 having a thickness of about 0.1–0.15 μm. This cycle is repeated once again to form a PZT film 142 on the PZT film 141.

Then the spin-coating machine is used to coat the PZT film 142 with the second sol, and the product is dried at about 190° C. before being pyrolyzed at about 400° C. in order to form a PZT film 143 having a thickness of about 0.1–0.15 μm. This cycle is repeated once again to form a PZT film 144 on the PZT film 143.

Further, the same heat treatment for the PZT films 41–44 in Embodiment 1 is applied to each of the PZT films 141–144 thus obtained to form a PZT film 140A as the lower layer. In this heat treatment, the crystallization of the PZT film is started from the proximity of the interface with the lower electrode 3, that is, from the PZT film 141. Therefore, the control of the composition of the PZT film 141 greatly affects the crystallization of the whole PZT film.

Since lead is excessively contained in the first sol, the crystalline growth of the PZT film can be promoted in Embodiment 2 of the present invention. Consequently, the whole PZT film can be made with a preferred crystalline orientation (high C-axis orientation).

Figure 11:
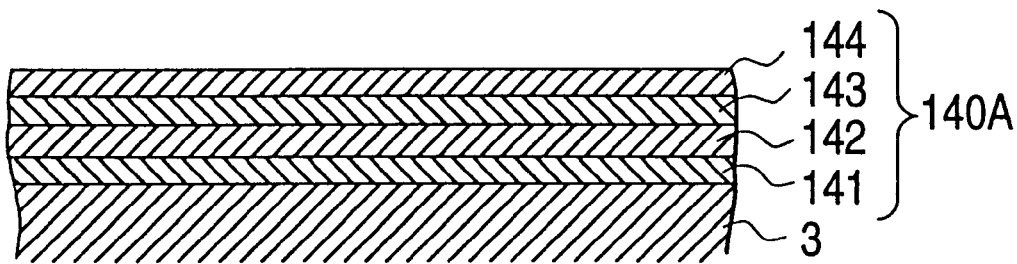
FIGS. 11(A)–11(C) are detailed sectional views of the piezoelectric film of FIG. 10(B)
Figure 11:
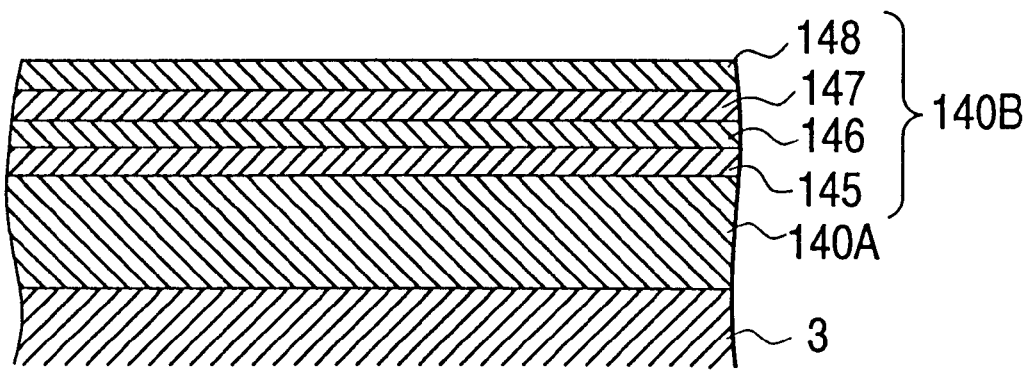
Figure 11:
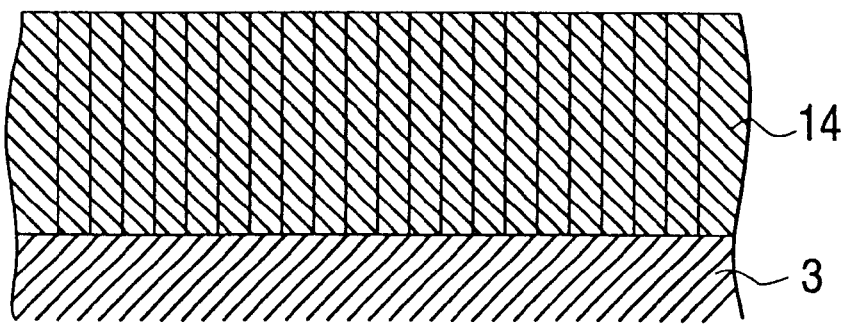

As shown in FIG. 11(B), further, the spin-coating machine is used to apply the second sol onto the PZT film 140A as the lower layer formed in FIG. 11(A), and the product is dried at about 180° C. before being pyrolyzed at about 400° C. in order to form a PZT film 145 which is about 0.1–0.15 μm thick. This cycle is repeated three times to form PZT films 146, 147 and 148 on the PZT film 145.

Further, the heat treatment made at the step shown in FIG. 11(A) is carried out to form a PZT film 140B as the upper layer. Here, the heat treatment is carried out at 600° C. for five minutes and continuously at 850° C. for one minute. Thus, the PZT film 14 constituted of the PZT film 140A as the lower layer and the PZT film 140B as the upper layer is obtainable (see FIG. 11(C)).

As shown in FIG. 10(C), an upper electrode 5 may be formed on the piezoelectric film 14. The steps described above may be followed to form a piezoelectric element where the first sol is prepared so that the value of x in the general term is 1 and the value of y is 1, or that the value of x in the general term is 1.2 and the value of y is 1, or that the value of x in the general term is 1.4 and the value of y is 1.

Figure 12:
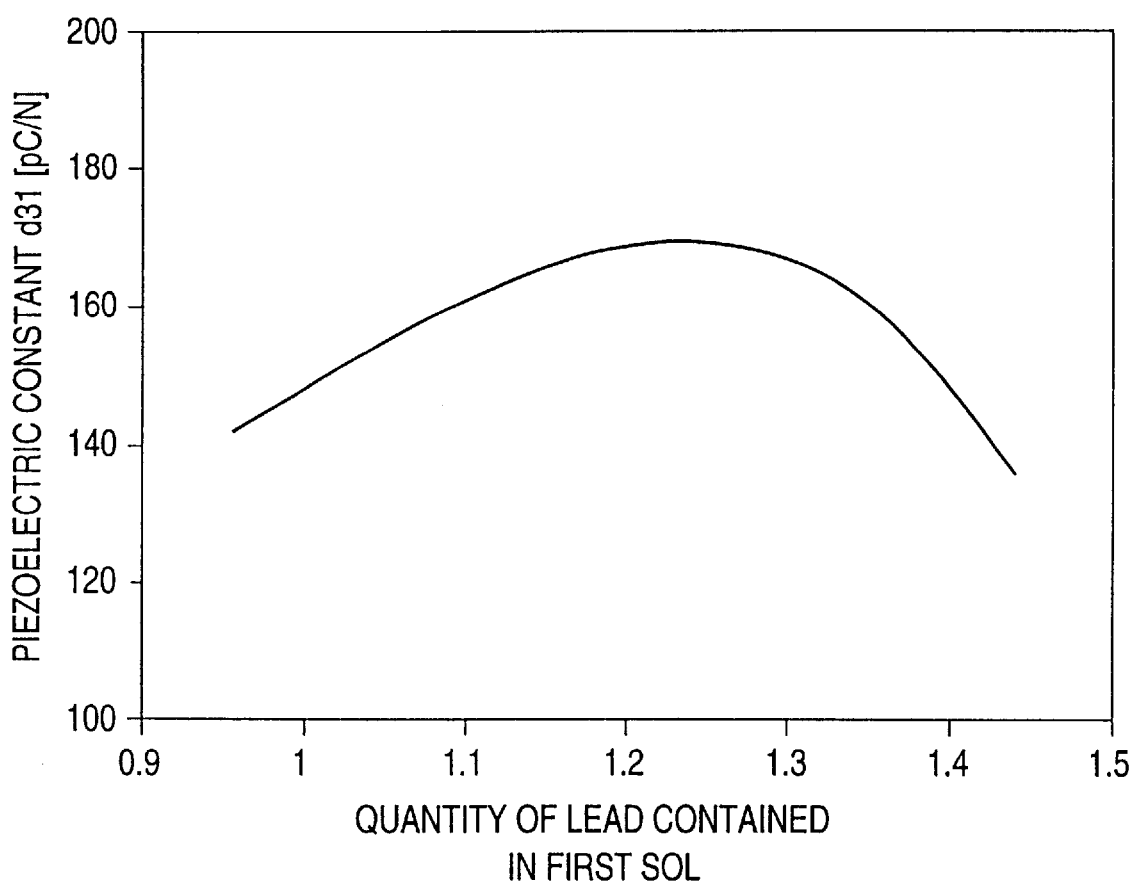
FIG. 12 is a graph showing dielectric characteristics of the piezoelectric element according to the second embodiment of the present invention in comparison with a conventional piezoelectric element.

FIG. 12 shows the results of piezoelectric constants (d31(pC/N)) of piezoelectric elements of the second embodiment in comparison with a conventional element.

As is obvious from FIG. 12, the piezoelectric constant of the piezoelectric element according to the present invention (with the value of x exceeding 1 and not greater than 1.4) is seen to have achieved a great deal of improvement in comparison with what has employed the first sol prepared with the value of x at 1 and a value of y at 1 in the general term (the prior art product).

Although a description has been given of the case where four layers 141–144 are used to form the PZT film 140A as the lower layer and four layers 145–148 are used to form the PZT film 140B as the upper layer in Embodiment 2 of the present invention, the invention is not limited to this case but may be applicable to the film resulting from applying the first sol thereto, drying and pyrolyzing it in at least one cycle, again applying the second sol having a greater lead content than the first sol thereto, then drying, pyrolyzing and heat-treating it at predetermined temperatures Although a description has been given of the case where Pb is employed as A, whereas $Zr_{0.52}$ and $Ti_{0.48}$ are employed as B according to this embodiment of the present invention, the invention Is not limited to this case but may be applicable to a case where La, Ca or the like other than Pb is employed as A, whereas Mg, Nb or the like or the combination of these other than Zr and Ti is employed as B in the general term.

Moreover, the processing conditions according to this embodiment of the present invention, for example, the film thickness, the heat-treatment temperature, the application of the first and second sols and the like may be varied to the extent that the performance of the piezoelectric element is not impaired.

As set forth above, according to the present invention, a film is formed by forming a coating with the first sol for forming the piezoelectric film at least once and by applying to the resulting film a second sol having a greater lead content than the first sol, and subjecting both resulting films to heat treatment at a predetermined temperature so as to obtain the piezoelectric film. Therefore, the difference in the existing quantity-of lead in the thickness direction of the piezoelectric film decreases in comparison with the piezoelectric film of the conventional piezoelectric element. In other words, a piezoelectric element s formed with the lead distributed suitably and uniformly consequently, the piezoelectric and dielectric characteristics can be improved.

According to the present invention, further, the first and second sol have a composition capable of forming a piezoelectric film having the Perovskite crystalline structure and is expressed generally by $A_xB_yO_3$. Additionally, the content of crystallizing precursor material constituting the A site of the first sol is greater than what constitutes the A site of the second sol. Therefore, part of the adhesion layer with respect to the substrate of the lower electrode is diffused in the lower electrode at the time of crystallizing annealing, and the crystallizing precursor material in the proximity of the interface of the lower electrode can be prevented from becoming excessive in the B site. Consequently, the crystal growth in the proximity of the interface of the lower electrode where the crystallization is started at the time of crystallizing annealing is promoted. Thus, the whole piezoelectric film can be made a columnar film having high orientation and large crystalline grains. Consequently, a piezoelectric element with improved piezoelectric characteristics is producible.

What is claimed is:

1. A process for producing a piezoelectric element comprising a piezoelectric film, an upper electrode and a lower electrode with the piezoelectric film held therebetween, said process comprising:

a) applying, at least once, a first sol for use in forming the piezoelectric film on a substrate having the lower electrode formed thereon to form a lower film;

b) drying the lower film by subjecting to heat treatment at a first temperature;

c) pyrolyzing the lower film by subjecting to heat treatment at a second temperature which is higher than the first temperature;

d) applying a second sol having a greater lead content than the first sol to form an upper film;

e) drying the upper film by subjecting to heat treatment at the first temperature;

f) pyrolyzing the upper film by subjecting to heat treatment at the second temperature;

g) crystallizing the lower and upper films by subjecting to heat treatment at a third temperature which is higher than the second temperature after step f);

h) performing a cycle comprising steps a) to f); and i) crystallizing the films by subjecting to heat treatment at a fourth temperature which is higher than the third temperature, after step h);

wherein a cycle comprising steps a) to g) is performed at least once.

2. A process for producing a piezoelectric element as claimed in claim 1, wherein the second sol contains 5%–43% more lead than the lead contained in the piezoelectric film to be ultimately obtained.

3. A process for producing a piezoelectric element as claimed in claim 2, wherein the second sol contains 20%–30% more lead than the lead contained in the piezoelectric film to be ultimately obtained.

4. A process for producing a piezoelectric element as claimed in claim 1, wherein the cycle is repeated twice.

5. A process for producing a piezoelectric element as claimed in claim 1, wherein step (a) is repeated three times.

6. A process for producing a piezoelectric element comprising a piezoelectric film, an upper electrode and a lower electrode with the piezoelectric film held therebetween, said process comprising:

a) applying, at least once, a first sol for use in forming the piezoelectric film on a substrate having the lower electrode formed thereon to form a lower film;

b) applying a second sol for use in forming the piezoelectric film to form an upper film; and c) subjecting the upper and lower films to heat treatment at a predetermined temperature after step b), wherein the first and second sols have a composition capable of forming a piezoelectric film having a perovskite structure expressed by $A_xB_yO_3$ in general terms, wherein a constituent of A in the first sol and a constituent of A in the second sol are identical, wherein a constituent of B in the first sol and a constituent of B in the second sol are identical, wherein A comprises at least one of Pb, La, and Ca, and B comprises at least one of Ti, Zr, Mg and Nb, and wherein the value of x of the first sol is greater than the value of x of the second sol.

7. A process for producing a piezoelectric element as claimed in claim 6, wherein a partial component of the B site or its oxide is used for the lower electrode as an adhesion layer with respect to the substrate.

8. A process for producing a piezoelectric element as claimed in either claim 6 or 7, wherein the value of x of the first sol exceeds the value of x of the second sol but is 1.4 times or less.

9. A process for producing a piezoelectric element as claimed in claim 8, wherein the value of x of the first sol is 1.2–1.3 times the value of the second sol.

* * * * *